(12) United States Patent
Yang et al.

(10) Patent No.: US 7,961,032 B1
(45) Date of Patent: Jun. 14, 2011

(54) METHOD OF AND STRUCTURE FOR RECOVERING GAIN IN A BIPOLAR TRANSISTOR

(75) Inventors: Zhijian Yang, Hopewell Junction, NY (US); Ping-Chuan Wang, Hopewell Junction, NY (US); Kai Di Feng, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/627,282

(22) Filed: Nov. 30, 2009

(51) Int. Cl.
*H03K 17/60* (2006.01)
(52) U.S. Cl. ........................................ 327/478; 327/419
(58) Field of Classification Search .................. 327/419, 327/478; 326/75, 89
See application file for complete search history.

(56) References Cited

U.S. PATENT DOCUMENTS

| | | | |
|---|---|---|---|
| 4,143,421 A | 3/1979 | Tonnel et al. | |
| 5,079,447 A | 1/1992 | Lien et al. | |
| 5,764,650 A | 6/1998 | Debenham | |
| 5,949,128 A | 9/1999 | Shibib | |
| 5,982,225 A * | 11/1999 | Forhan et al. | 327/538 |
| 6,138,256 A | 10/2000 | Debenham | |
| 6,219,810 B1 | 4/2001 | Debenham | |
| 6,275,059 B1 | 8/2001 | Sah et al. | |
| 6,523,144 B2 | 2/2003 | Debenham | |
| 6,587,980 B2 | 7/2003 | Debenham | |
| 6,650,103 B2 | 11/2003 | Righter | |
| 7,076,699 B1 | 7/2006 | Puri et al. | |
| 7,159,882 B2 | 1/2007 | Buhrman | |
| 7,220,604 B2 | 5/2007 | Satake et al. | |
| 7,238,565 B2 | 7/2007 | Guarin et al. | |
| 7,251,164 B2 | 7/2007 | Okhonin et al. | |
| 7,300,819 B2 | 11/2007 | Noguchi | |
| 7,402,815 B2 | 7/2008 | Gagnon et al. | |
| 7,679,410 B1 * | 3/2010 | Steinbrecher | 327/108 |
| 7,821,330 B2 * | 10/2010 | Wang et al. | 327/538 |

(Continued)

OTHER PUBLICATIONS

Huang, C.J.. et al. "Temperature Dependence and Post-Stress Recovery of Hot Electron Degradation Effects in Bipolar Transistor"—IEEE 1991 Bipolar Circuits and Technology Meeting 7.5—pp. 170-173. Sun, C.Jack, et al. "Hot-Electron-Induced Degradation and Post-Stress Recovery of Bipolar Transistor Gain and Noise Characteristics"—IEEE Transactions on Electron Devices, vol. 39, No. 9—Sep. 1992—pp. 2178-2180.

*Primary Examiner* — Hai L Nguyen
(74) *Attorney, Agent, or Firm* — Joseph P. Abate

(57) ABSTRACT

A method of recovering gain in a bipolar transistor includes: providing a bipolar transistor including an emitter, a collector, and a base disposed between junctions at the emitter and the collector; reverse biasing the junction disposed between the emitter and the base with an operational voltage and for an operational time period, so that a current gain $\beta$ of the transistor is degraded; idling the transistor, and generating a repair current $I_{br}$ into the base, while forward biasing the junction disposed between the emitter and the base with a first repair voltage ($V_{EBR}$), and while at least partly simultaneously reverse biasing the junction disposed between the collector and the base with a second repair voltage ($V_{CBR}$), for a repair time period ($T_R$), so that the gain is at least party recovered; wherein $V_{EBR}$, $V_{CBR}$ and $T_R$ have the proportional relationship: $T_R \propto (\Delta\beta)^2 \times \exp[1/(Tam+Rth \times Ie \times V_{CER})]$, $V_{CER}=V_{BER}+V_{CBR}$, and $Ie=\beta \times I_{br}$, $\beta$ is the normal current gain of the transistor, $\Delta\beta$ is the target recovery gain of the transistor in percentage, Tam is the ambient temperature in degrees K, $I_{br}$ is the repair current to the base in μamps, Rth is the self-heating thermal resistance of the transistor in K/W, $T_R$ is in seconds. The invention further includes structures for implementing the method.

23 Claims, 13 Drawing Sheets

U.S. PATENT DOCUMENTS

| | | |
|---|---|---|
| 2002/0046361 A1 | 4/2002 | Debenham |
| 2003/0005377 A1 | 1/2003 | Debenham |
| 2003/0214047 A1 | 11/2003 | Noguchi |
| 2004/0015764 A1 | 1/2004 | Debenham |
| 2005/0224457 A1 | 10/2005 | Satake et al. |
| 2005/0258526 A1 | 11/2005 | Noguchi |
| 2007/0245190 A1 | 10/2007 | Debenham |
| 2008/0124815 A1 | 5/2008 | Malone et al. |
| 2008/0308930 A1 | 12/2008 | Yoshida |
| 2009/0190413 A1 | 7/2009 | Hsu et al. |

* cited by examiner

METHOD OF AND STRUCTURE FOR RECOVERING GAIN IN A BIPOLAR TRANSISTOR

FIELD OF THE INVENTION

The present invention relates to bipolar transistors and, more particularly, to methods and structures for recovering gain lost or degraded because of, for example, a hot carrier effect.

BACKGROUND OF THE INVENTION

Bipolar transistors are electronic devices with two p-n junctions that are in close proximity to each other. A typical bipolar transistor has three device regions: an emitter, a collector, and a base disposed between the emitter and the collector. Ideally, two p-n junctions, i.e. the emitter-base and collector-base junctions, are separated by a specific distance. Modulation of the current flow in one p-n junction by changing the bias of the nearby junction is called "bipolar transistor action."

If the emitter and collector are doped n-type and the base is doped p-type, the device is an "npn" transistor. Alternatively, if the opposite doping configuration is used, the device is a "pnp" transistor. Because of the mobility of minority carriers, i.e. electrons, in the base region of npn transistors, higher frequency operation and higher speed performances can be obtained with npn transistors. Therefore, the present inventors believe npn transistors comprise many of the bipolar transistors used to build integrated circuits. In FIG. 1(a) and FIG. 1(b), prior art npn and pnp bipolar transistors Q0, Q1, in addition to respective base bias circuits, switches P0, N0, collector load circuits and emitter load circuits are shown.

Performance wear-out over a device (bipolar transistor) operating lifetime has been a major problem for all semiconductor devices. One of the wear-out mechanisms is the known hot carrier effect due to reverse bias of the base-emitter junction in bipolar devices. In some circuit applications, the base-emitter junction is required to be reverse biased at a high voltage (such as $V_{BE}$=1.5 volts or higher) for a long time, which would severely degrade key device performance parameters, in particular a current gain (hfe "aka" $\beta$). The current gain $\beta$ is a ratio of the collector current $I_c$ divided by the base current $I_b$. The reverse bias of the base-emitter junction at a high voltage for a long time significantly reduces the bipolar transistor operating lifetime.

For discussions of the hot carrier effect and reverse bias of the base-emitter junction in bipolar transistors, see, for example: HOT-ELECTRON-INDUCED DEGRADATION AND POST-STRESS RECOVERY OF BIPOLAR TRANSISTOR GAIN AND NOISE CHARACTERISTICS, by Sun et al., *IEEE Transections on Electron Devices*, Vol. 39, No. 9, September 1992, pgs. 2178-2180; TEMPERATURE DEPENDENCE AND POST-STRESS RECOVERY OF HOT ELECTRON DEGRADATION EFFECTS IN BIPOLAR TRANSISTORS, by Huang et al., *IEEE* 1991 *Bipolar Circuits and Technology*, 5/91, pgs. 170-173.

Traditionally, bipolar device manufacturers and designers are limited by a maximum allowed base-emitter reverse voltage ($V_{BE}$) in order to ensure reliability in the transistor operation lifetime. However, as the reverse voltage limit continues to be reduced in advanced semiconductor technology with more demanding performance requirements and ever shrinking device dimensions, it is becoming very problematic for circuit designers to use standard circuit libraries developed from previous technologies (e.g., larger technology nodes).

For example, a customer may desire a semiconductor foundry to support a transistor circuit (device) with a reverse bias voltage ($V_{BE}$) at 3.0V using, for example, BiCMOS6WL technology of IBM that offers a reverse voltage bias limit of approximately (±10%) 1.75V. With traditional reliability guidelines and models, such a design significantly impacts reliability during the transistor lifetime and, thus, is problematic. Meeting reliability requirements for such transistor designs is very challenging. It is, therefore, very important for, for example, a semiconductor foundry or other semiconductor manufacturer to have a solution in order to alleviate this base-emitter junction reverse bias voltage limit.

U.S. Pat. No. 7,238,565 B2 entitled "METHODOLOGY FOR RECOVERY OF HOT CARRIER INDUCED DEGRADATION IN BIPOLAR DEVICES," by Guarin et al., issued Jul. 3, 2007, discloses the recovery of degradation caused by the hot carrier effect in the base-collector junction using thermal annealing. A method of forward biasing a bipolar transistor for degradation recovery is also disclosed in this patent. In one of several embodiments disclosed in the '565B2 Patent, a high forward current around the peak fT current is provided to the bipolar transistor while operating below an avalanche condition ($V_{CB}$ of less than 1 volt). The high forward current contributes to increase the temperature of the bipolar transistor to about 200° C. or greater. More particularly, appropriately increasing the temperatures of the base-collector junction and the base-emitter junction contributes to recovering the degradation significantly. U.S. Pat. No. 7,238,565 B2 is hereby incorporated in its entirety herein by reference.

The present inventors believe that improvements to the invention disclosed in U.S. Pat. No. 7,238,565 B2, assigned to International Business Machines Corporation (the assignee of the present invention and patent application) are achievable, particularly with respect to implementations (methods and arrangements) for gain recovery in a bipolar transistor.

SUMMARY OF THE INVENTION

According to the present invention, a method of recovering gain in a bipolar transistor comprises: providing a bipolar transistor including an emitter, a collector, and a base disposed between junctions at the emitter and the collector; reverse biasing the junction disposed between the emitter and the base with an operational voltage and for an operational time period, so that a current gain ($\beta$) of the transistor is degraded; idling the transistor, generating a repair current $I_{br}$ into the base, while forward biasing the junction disposed between the emitter and the base with a first repair voltage ($V_{BER}$), and while at least partly simultaneously reverse biasing the junction disposed between the collector and the base with a second repair voltage ($V_{CBR}$), for a repair time period ($T_R$), so that the gain is at least party recovered; wherein $V_{BER}$, $V_{CBR}$ and $T_R$ have the proportional relationship:

$$T_R \propto (\Delta\beta)^2 \times \exp[1/(Tam+Rth \times Ie \times V_{CER}], V_{CER}=V_{BER}+V_{CBR}, \text{ and } Ie=\beta \times I_{br},$$

$\beta$ is the normal current gain of the transistor, $\Delta\beta$ is the target recovery gain of the transistor in percentage, Tam is the ambient temperature in degrees K, $I_{br}$ is the repair current to the base in $\mu$ amps, Rth is the self-heating thermal resistance of the transistor in K/W, $T_R$ is the repair time period in seconds.

A bipolar transistor recovery arrangement comprises: a bipolar transistor including an emitter, a collector, and a base disposed between junctions at the emitter and the collector, the transistor having a current gain ($\beta$) that is degraded; a collector load circuit connected to the collector, an emitter circuit connected to the emitter, and a base bias circuit connected to the base and in parallel with the collector load circuit; and a gain recovery circuit connected to the base and in parallel with the base bias circuit, the gain recovery circuit including a current source connected in parallel with a current mirror for generating a repair current ($I_{br}$) to the base during a repair time period ($T_R$); wherein the $V_{BER}$, $V_{CBR}$ and $T_R$ have the proportional relationship:

$$T_R \propto (\Delta\beta)^2 \times \exp\left[1/(Tam+Rth \times Ie \times V_{CER})\right], V_{CER}=V_{BER}+V_{CER}, \text{ and } Ie=\beta \times I_{br},$$

$\beta$ is the normal current gain of the transistor, $\Delta\beta$ is the target recovery gain of the transistor in percentage, Tam is the ambient temperature in K, $I_{br}$ is the repair current to the base in $\mu$ amps, Rth is the self-heating thermal resistance of the transistor in K/W, $T_R$ is in seconds.

A further embodiment of the method according to the invention includes monitoring the degradation, and then idling the transistor when the degradation reaches a preset threshold. In general, according to embodiments of the invention, higher values of $I_{br}$ and accordingly $V_{BER}$ result in shorter recovery times (repair times) $T_R$

BRIEF DESCRIPTION OF THE DRAWING

Further and still other embodiments of the invention will become more readily apparent when the detailed description is taken in conjunction with the following drawing, in which.

DETAILED DESCRIPTION OF THE INVENTION INCLUDING BEST MODES

Preferred embodiments of the present invention will now be described in more detail with reference to the accompanying drawing figures.

The performance degradation caused by a high voltage reverse bias across the base-emitter junction can be significantly recovered by switching the degraded device into a repair mode in which a high forward current causes a high forward bias $V_{BER}$ and a low reverse bias $V_{CBR}$ for a suitable (e.g. short) period of time. "High" as used in this context for $V_{BE}$ means high for $V_{BE}$ in 6WL (low bias for $V_{BE}$ in 6WL Technology is approx. 0.81 volts). "Low" as used in this context for $V_{CB}$ means low for $V_{CB}$ in 6WL Technology (high bias for $V_{CB}$ in 6WL is approx. 4 volts.

Figure 1B:
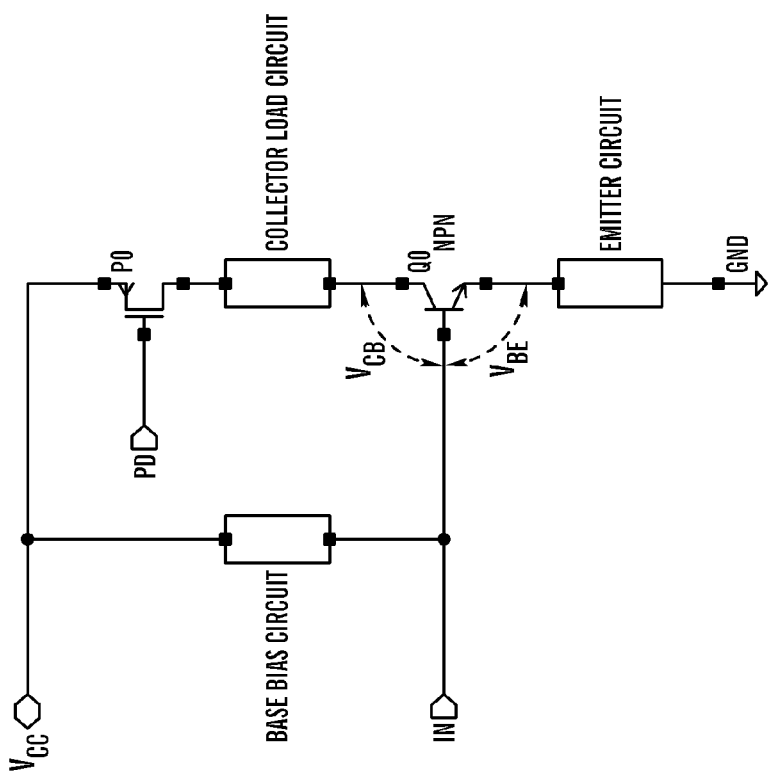
FIG. 1(b) shows equivalent components suitable for an arrangement including a pnp transistor, also according to the prior art.
Figure 1A:
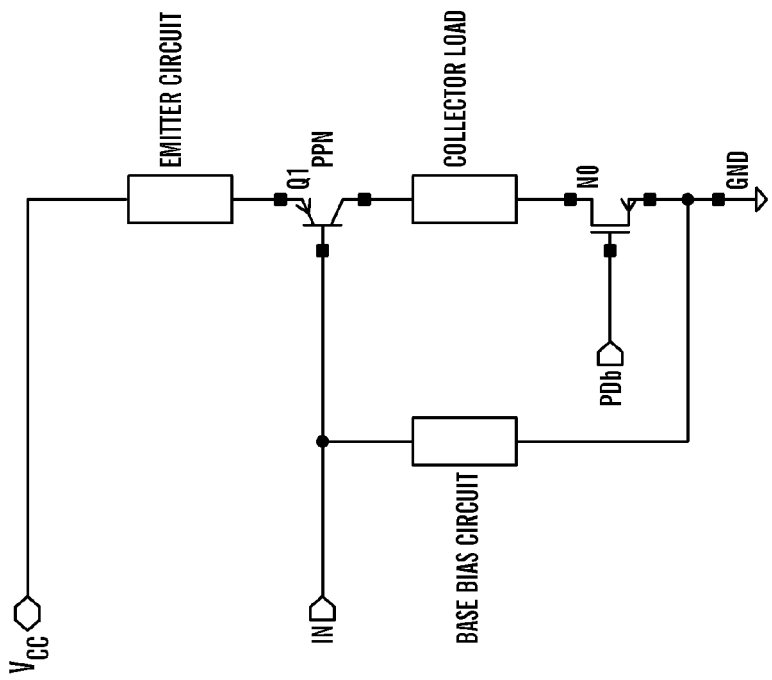
FIG. 1(a) is a schematic circuit diagram of an npn transistor, a base bias circuit, a collector load circuit, an emitter circuit, a switch P0, sources of potential PD, $V_{CC}$, IN, gnd, all according to the prior art.
Figure 2:
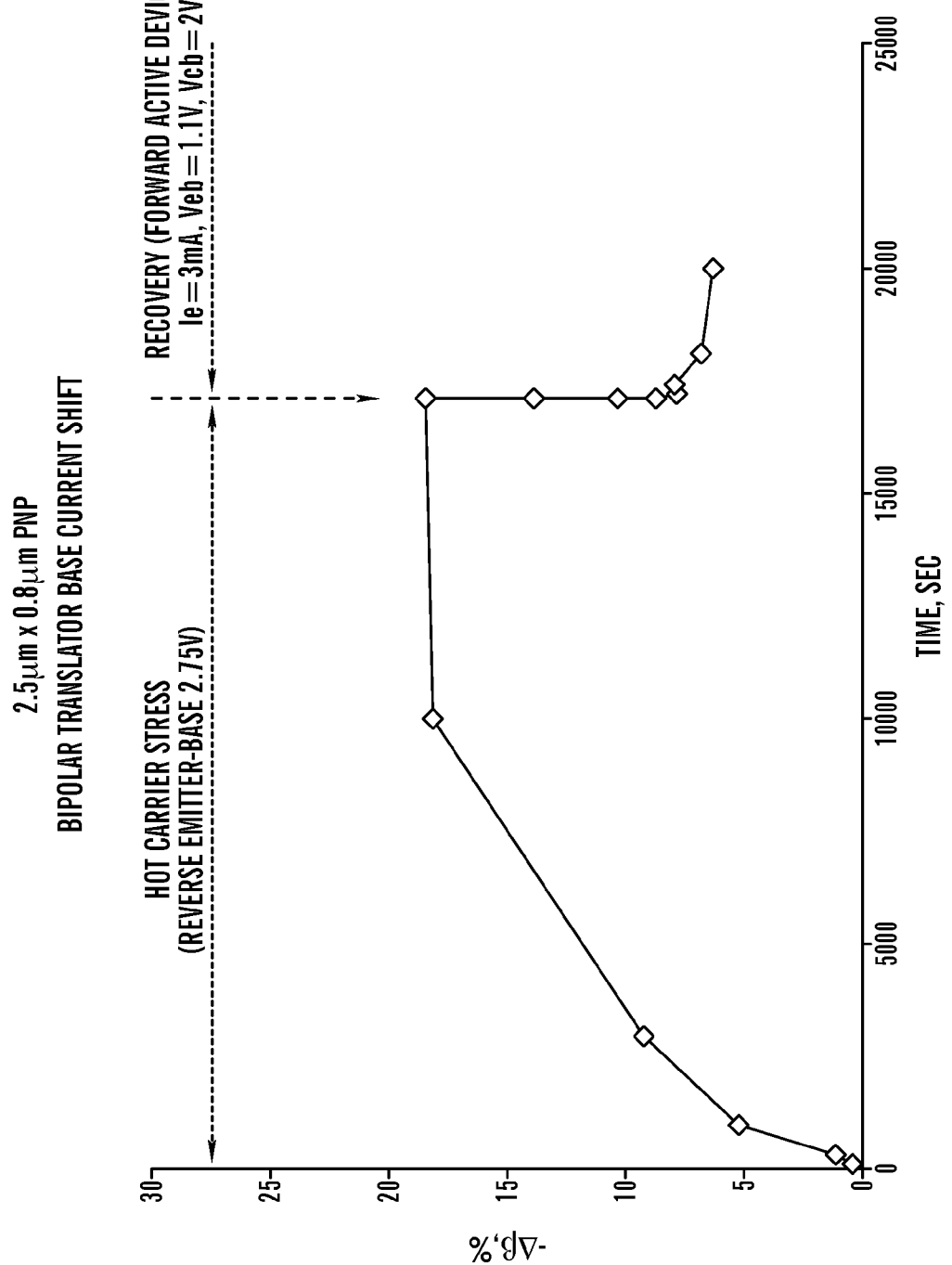
FIG. 2 is a chart showing experimental results for gain degradation (influenced by hot carrier stress: $V_{BE}$ reversed biased at 2.75 volts) and gain recovery according to a preferred embodiment of the invention utilizing a high forward active bias ($V_{BE\_repair}$=1.1 volt) across the base-emitter junction and a low reverse bias ($V_{CB\_repair}$=2 volts) across the collector-base junction of a pnp bipolar transistor according to IBM BiCMOS 6WL technology.

As shown in the experimental data chart of FIG. 2, the current gain of the device (pnp) is reduced by as much as 18% in less than 5 hours at an elevated reverse bias voltage (2.75V) across the base-emitter junction. When the device is switched to the repair mode (i.e., active mode with forward BE junction biased at 1.1V), the current gain ($\beta$) is significantly recovered (about 67% recovery) within merely a few seconds. The collector-base junction was reversed biased with $V_{CBR}$ at 2 volts. In the inventors' opinions, this data clearly demonstrates benefits of this invention for semiconductor bipolar device repair.

Figure 8:
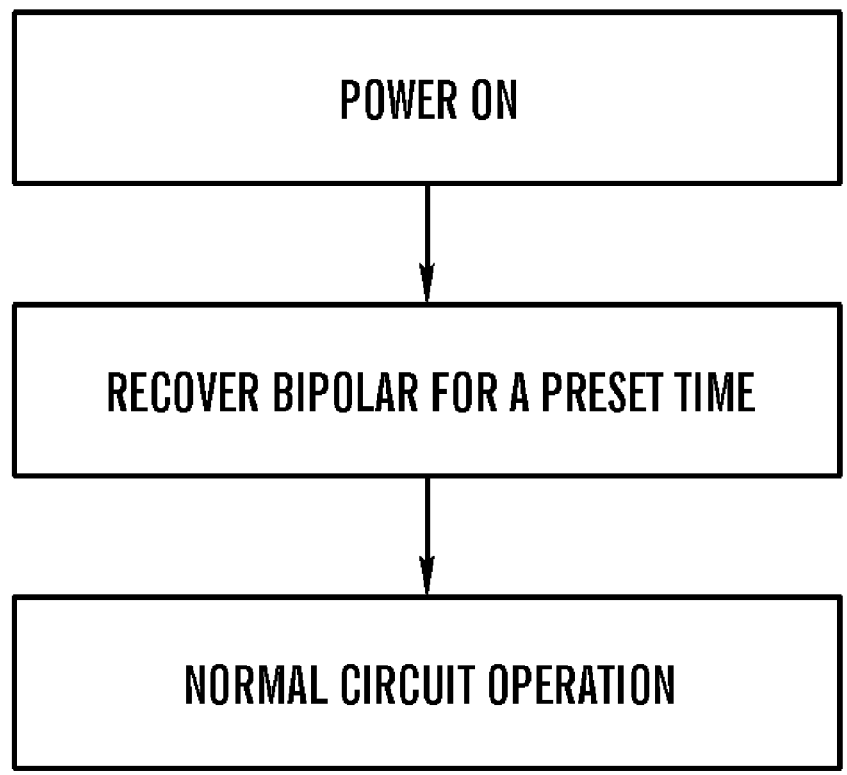
FIG. 8 is a flow diagram of a first preferred embodiment of a method of gain recovery according to the present invention.
Figure 10:
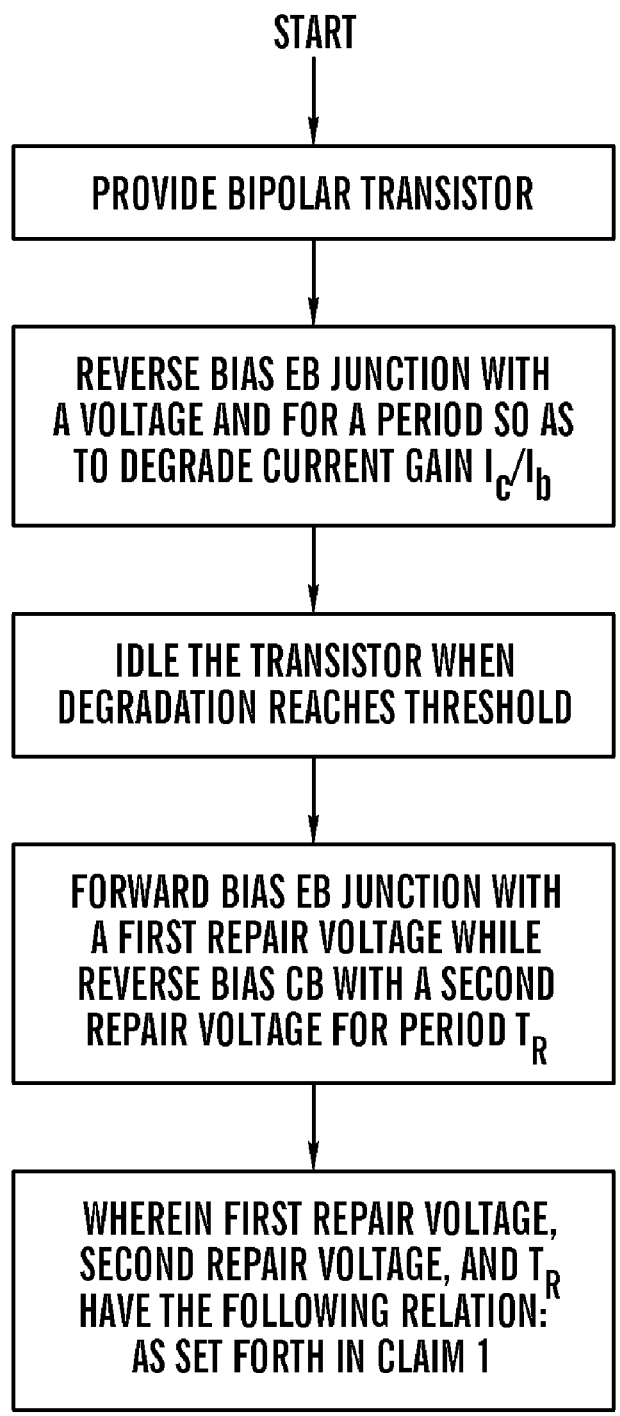
FIG. 10 is a more detailed flow diagram of the method shown in FIG. 8.

A first preferred embodiment of a method according to the present invention is shown in FIG. 8, and in more detail in FIG. 10. In FIG. 8, the following steps are performed: Power On, Recover Bipolar for a Preset Time, and then Return to Normal Circuit Operation. In FIG. 10, the steps A-D are performed in sequence and according to the proportional relationship referenced in block E. Step C may correspond to the Power On step of FIG. 8. In actual implementations of all embodiments of the present invention, more precise or rigorous relationships can be utilized. See, for example, the description under MORE RIGOROUS RELATIONSHIPS.

According to the preferred embodiments of the methods and apparatus (e.g. circuits) according to the invention disclosed herein, various features of the invention are shown in the figures listed within respective parentheticals as set forth below. The particular values shown are for the BiCMOS6WL or BiCMOS8HP Technology of IBM.

Device Repair Bias Conditions and Timing (FIGS. 3-11):

Forward bias emitter-base junction by supplying the repair current $I_{br}$ to the base, so that emitter current is close to peak fT current density and Veb_repair=0.8V~1.2V, and the collector-base junction is reverse biased at Vcb_repair=0.5V~2V.

Repair times ($T_r$) ranging from one second to 100 seconds (depending on the repairing base current $I_{br}$ which affects both repair emitter current $I_{er}$ and the voltages $V_{eb}$_repair ($V_{BER}$) and $V_{cb}$_repair ($V_{CBR}$), as is well understood by those skilled in the art in view of the present specification and figures.

$I_{br}$ is within a range of several hundred µA to ensure the emitter current $I_e$ is close to peak fT current. Preferably, 6WL: $I_{br}$ is in a range of approx. 10 µA to approx. 300 µA; 8HP: $I_{br}$ is in a range of approximately 100 µA to approximately 300 µA.

(1) Device Repair Circuit (FIGS. 3, 4, 8, 10):

Add repair circuit blocks 100N, 100P into the normal function blocks in the bipolar device circuit arrangements, comprising emitter-bias blocks, base-bias blocks and collector-bias blocks.

During normal operations of the devices Q0, Q1, the repair blocks are isolated and do not affect normal operations of the devices Q0, Q1.

During a repair process (e.g. in power-on sequence) according to an embodiment of the invention, the respective repair block 100N, 100P is switched on, and the respective degraded bipolar device Q0, Q1 is then biased at the repair mode ($I_{br}$, $V_{BER}$, $V_{CBR}$).

(2) Device Current Gain Monitor (FIGS. 5, 6, 7, 9. 11):

Add repair circuit blocks 100N, 100P into the arrangements with the normal function blocks in the bipolar device circuit arrangements, comprising emitter-bias blocks, base-bias blocks and collector-bias blocks.

During normal operations of the devices Q0, Q1, the repair blocks 100N, 100P do not operate and do not affect normal operation of the devices Q0, Q1.

Repair mode is enabled when the monitored device degradation exceeds a pre-determined level. For example, the degradation is monitored for device Q0 by means of the monitor 200N, and any decision that the degradation exceeds the predetermined level or threshold is performed in the controller 300N.

During a repair method (i.e. when the repair mode is triggered by the monitor and controller), the degraded bipolar device Q0, Q1 is then biased at the repair mode ($I_{br}$, $V_{BER}$, $V_{CBR}$) and e.g. $I_{br} \cong$ several hundred µA.

(1) Device repair during power-on sequence (FIG. 8).

Figure 9:
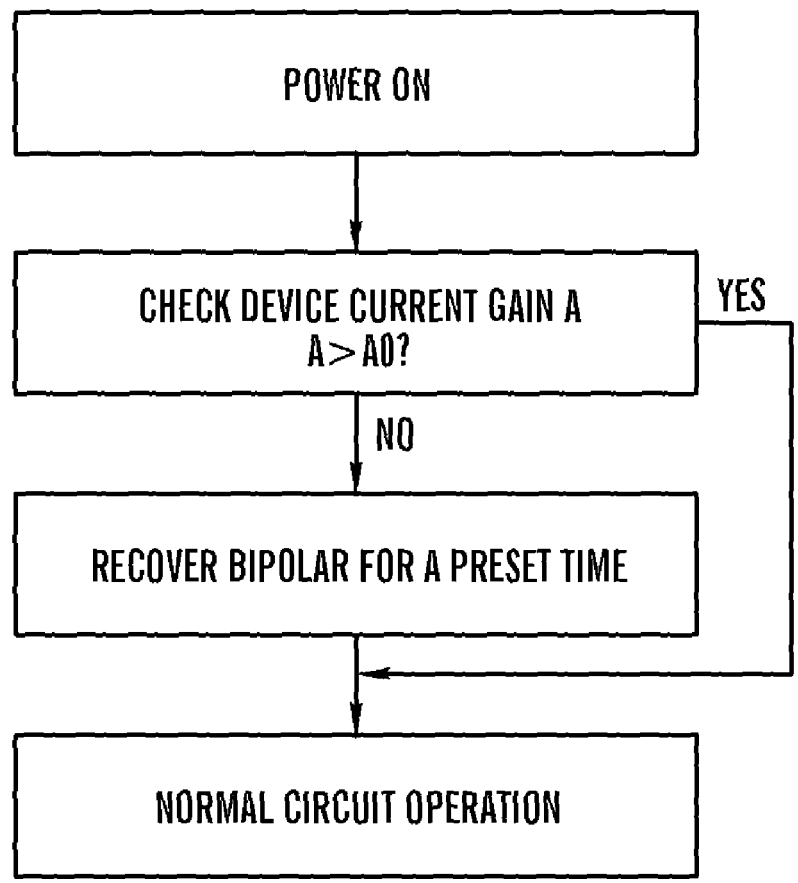
FIG. 9 is a flow diagram of a second preferred embodiment of a method of gain recovery according to the present invention.

(2) On-demand device repair, started when device current gain becomes less than a pre-determined value (FIG. 9).

Further detailed information for the circuit embodiments are described in the following Sections 1 and 2.

Circuit Embodiment 1

Device Repair Circuit

In order to facilitate the repair function, a current source is added to the base terminal of the device, as shown in FIG. 3(*a*), 3(*b*), 3(*c*), wherein the disclosed circuits 100N, 100P are the gain recovery current circuits (including current sources) for the npn and the pnp devices Q0, Q1, respectively (Circuit embodiment 1). During the system initialization (i.e. power-on) sequence of FIG. 8, the input signal GRC_b is at a logic low for the npn (or GRC is at a logic high for pnp) for a pre-defined period of time ranging from 1 second to 100 seconds (depending on the repairing bias voltages $V_{eb}$_repair and $V_{cb}$_repair), so that the extra base current $I_{br}$ flows through the degraded bipolar transistor for the recovery of the current gain β. Device repair is conducted each time during the power-on sequence, because in this embodiment, there is no monitor circuit to detect the device functionality.

In the embodiment of FIG. 3(*a*), the following are examples of preferred components and parameters:

Q0—npn transistor BiCMOS6WL/8HP manufactured by IBM Corporation;

emitter circuit includes, for example, a resistor having the resistance value of several tens ohms; Collector load circuit includes, for example, a resistor having the resistance value of several kilo ohms;

P0 is a FET pMOSFET of BiCMOS6WL/8HP made by IBM; base bias circuit includes, for example, a current source capable of generating a current having a value (in a range from about 10 micro amps to about 100 micro amps);

Vcc is typically in a range of 3 volts to 4 volts;

GRC_$b$ is a signal within a range of 0 volts to Vcc;

IN is a signal having the following range of values—several micro volts to several hundred micro volts; and Gain Recovery Source 100N generates a repair current $I_{br}$ having a value of typically several hundred micro amps.

Techniques for manufacturing the devices and other components described in the present specification or shown in figures are well within the skill in the art in view of the present specification and figures, and need not be further discussed. See, for example, *VLSI Technology*, by S. M. SZE, (2d Edition, ISBN 0-07-062735-5).

FIG. 3(*b*) shows an embodiment of the invention for a pnp connected to a gain recovery circuit 100P and other components as shown.

FIG. 3(*c*) is a more detailed schematic circuit diagram of a preferred embodiment for the embodiment of the present invention shown in FIG. 3(*a*). FIG. 3(*c*) shows components and component values for an embodiment that can be implemented in BiCMOS8HP Technology of IBM. For 6WL, the component values would differ, as would be understood by those skilled in the art.

Figure 3B:
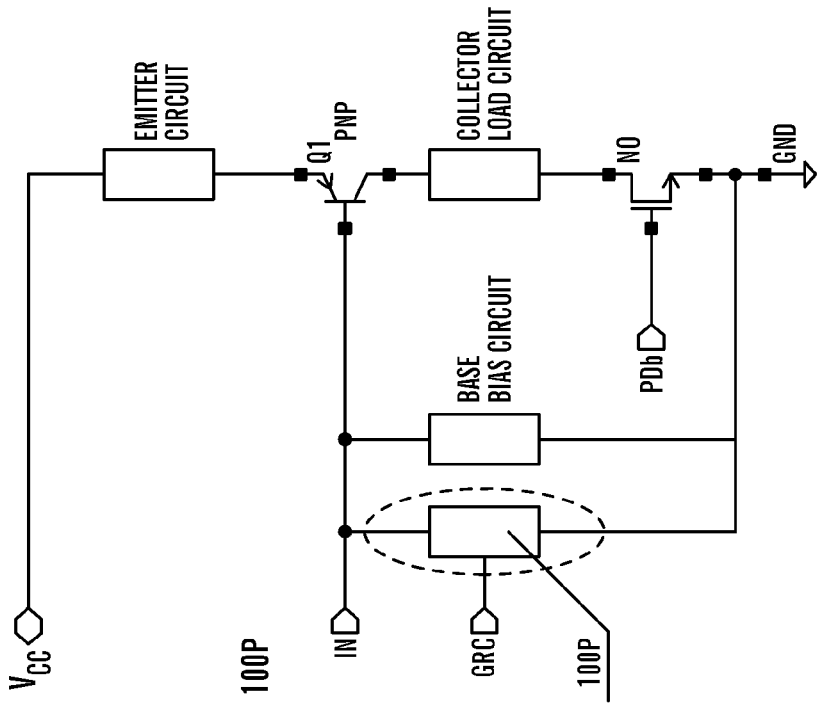
FIG. 3(b) shows equivalent components including a gain recovery circuit 100P (with input signal GRC) for a configuration (arrangement) including a pnp transistor Q1.
Figure 3A:
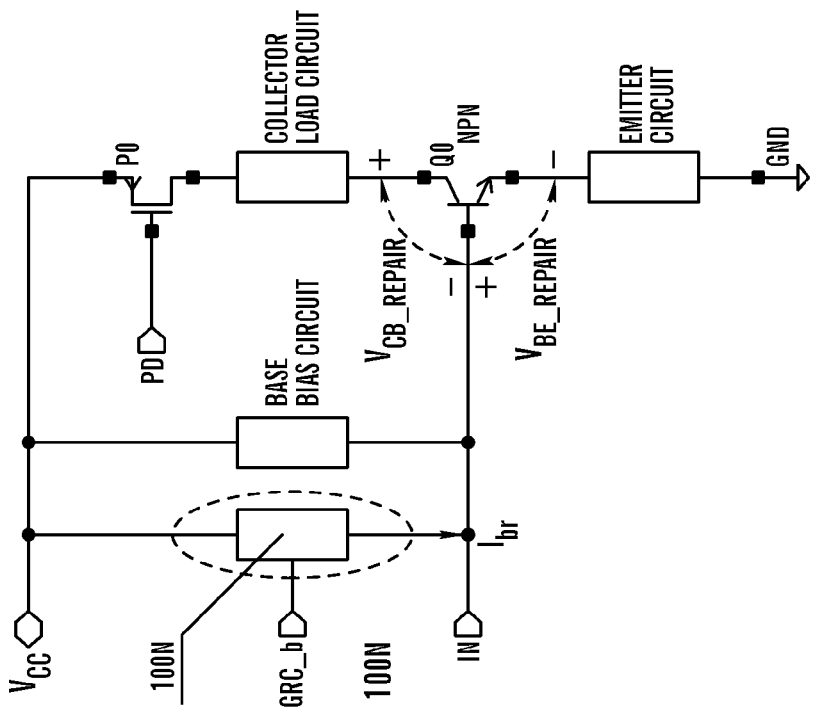
FIG. 3(a) is a schematic circuit diagram according to a first preferred circuit embodiment of the present invention, including a gain recovery circuit 100N with input signal GRC_b for the npn transistor Q0.
Figure 3C:
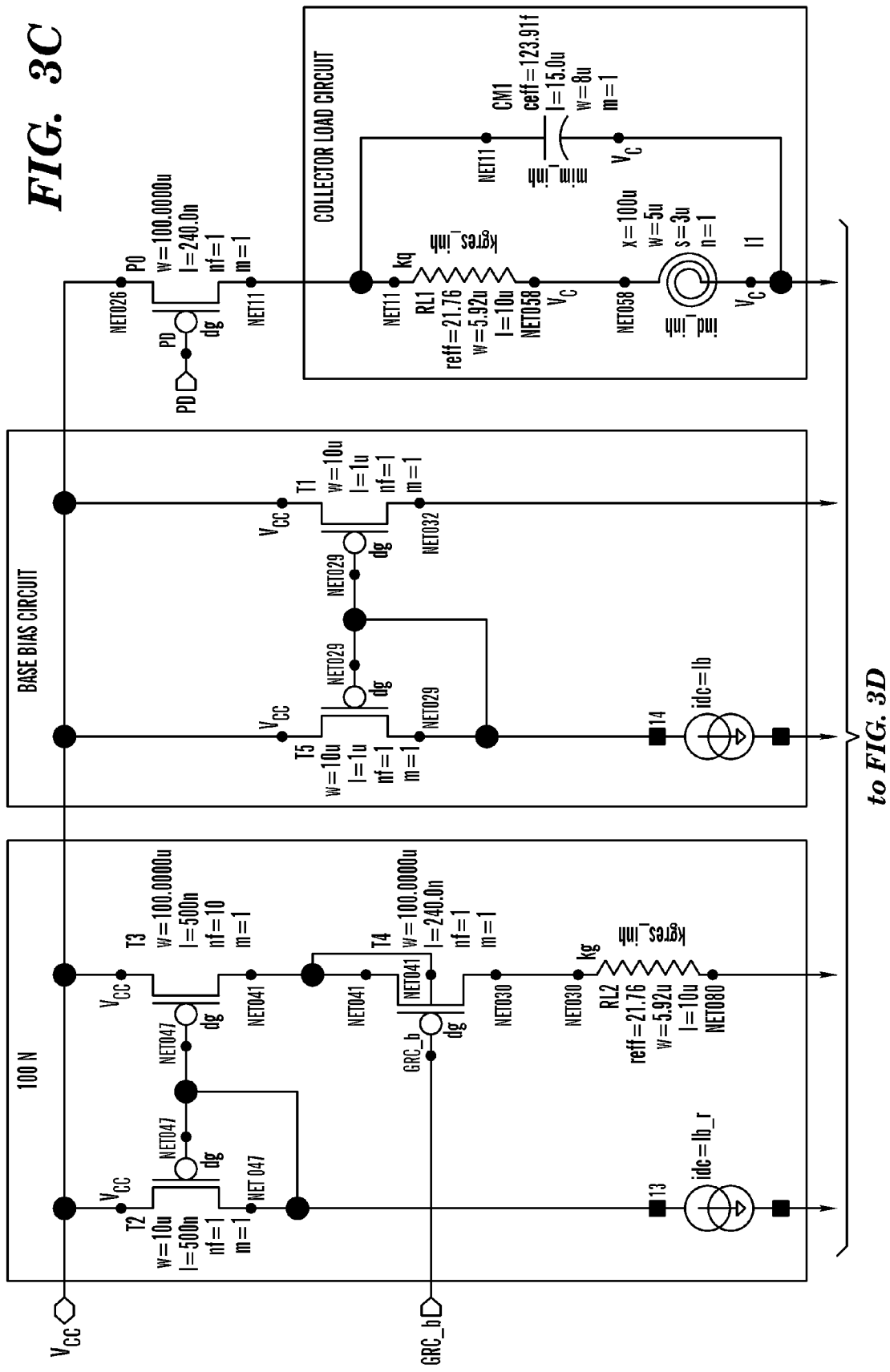
FIG. 3(c) is a more detailed schematic circuit diagram of a preferred embodiment for the embodiment shown in FIG. 3(a), including a repair current source 13 connected to a current mirror T2, T3.
Figure 3D:
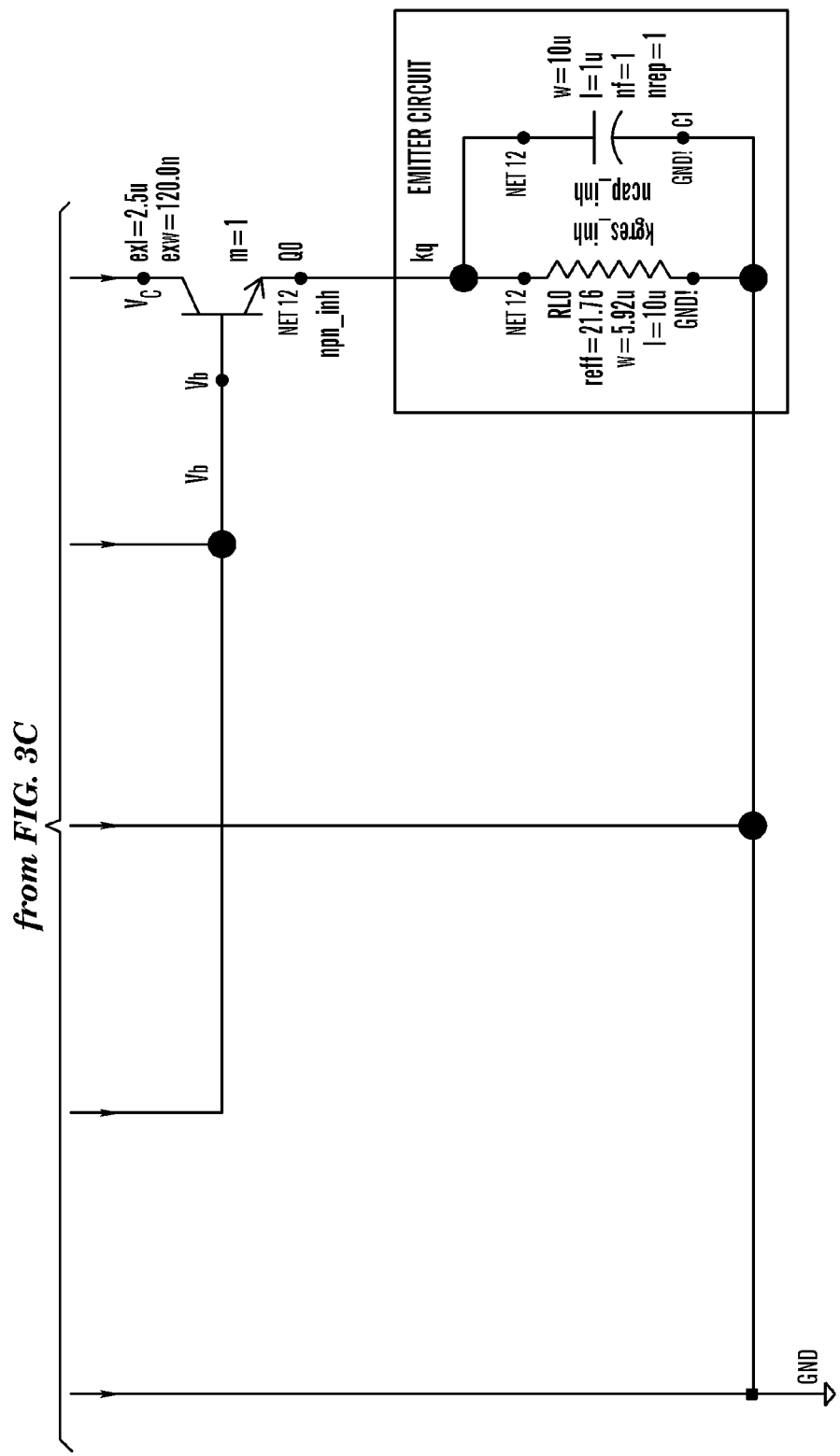
Figure 4B:
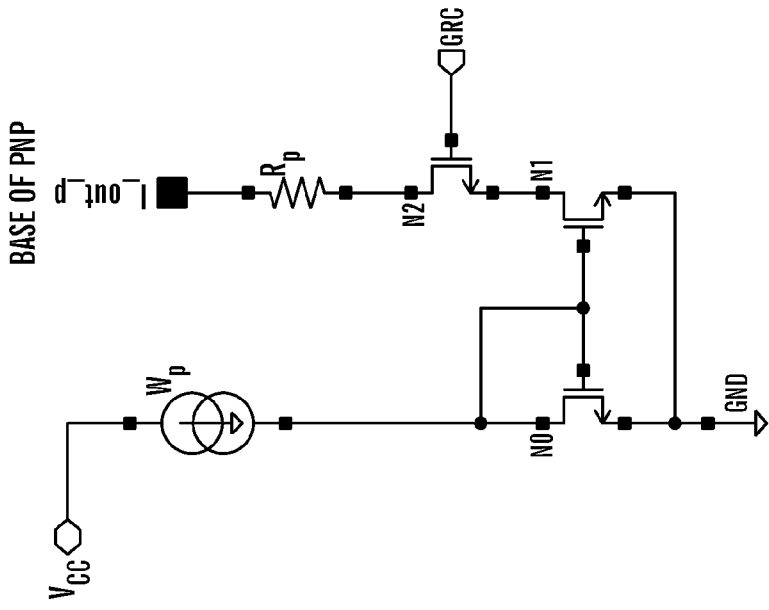
FIG. 4(b) is a more detailed schematic circuit diagram (larger scale) of a preferred embodiment of the gain recovery circuit 100P.
Figure 4A:
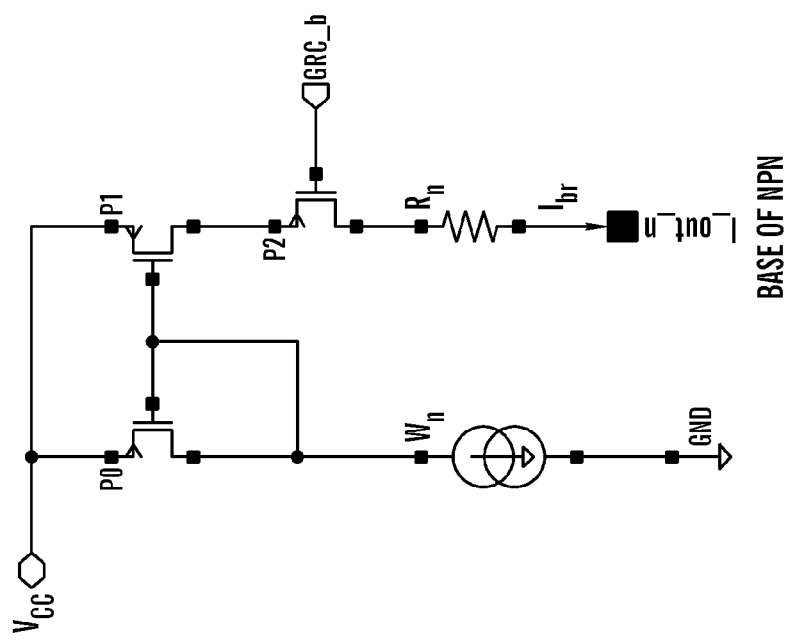
FIG. 4(a) is a schematic circuit diagram (larger scale) of the gain recovery circuit 100N in FIG. 3(c): 10N, P0 and P1 correspond to I3, T2 and T3 respectively.

FIG. 4 is the detailed circuit diagram of the gain recovery circuits (100N for npn type, and 100P for pnp type) shown in FIG. 3. I0*n* (for npn type) and I0*p* (for pnp type) are current sources; P0, P1 (for npn type) and N0, N1 (for pnp type) form respective current mirrors with the recovery base current adjustable depending on the mirror device width ratio; P2 (for npn type) and N2 (for pnp type) are switching FETs. When GRC_b is at logic low for npn (or GRC is at logic high for pnp), the gain recovery current $I_{br}$ flows to the respective bipolar device to be repaired.

In the embodiment of FIG. 4, the following are examples of preferred components and parameters:

P0, P1, P2 are FETs such as pMOSFETs in BiCMOS6WL/8HP manufactured by IBM Corporation;

10*n* is a current source capable of generating a current having a value of, for example, approximately 10 µA to approximately 500 µA.

Rn is a resistor with the following value, for example, of several hundred ohms.

The embodiments for a pnp transistor Q1 as shown in FIG. 3 and FIG. 4 can easily be configured by those skilled in the art in view of the instant specification and figures, and thus need not be further discussed in detail.

To Recapitulate:

During the normal operation of the circuits of FIG. 3(*a*) and FIG. 3(*b*), the recovery block, both 100N for NPN and 100P for PNP, is in off state and does not affect the normal operations of the circuits. In the recovery mode, the recovery block 100N, 100P generates a recovery current $I_{br}$ to the base of the targeted bipolar device Q0, Q1, and forces the targeted device into a high current forward active mode to recover the current gain degradation. The detailed operation is shown in FIGS. 3(*a*) and 3(*c*) for NPN device and in FIG. 3(*b*) for PNP device.

As an example, for NPN circuit, FIG. 3(a), we include one base current recovery circuit block 100N in the standard bipolar circuit. During the normal circuit operation, the recovery control signal GRC_b is in logic high and the block 100N is in off state and has no impact on the circuit normal operation. All other blocks in FIG. 3(a) are in their normal operational conditions, such as base, emitter and collector bias circuits which supply normal operational bias to the bipolar device Q0. P0 is a pMOSFET which is switched on to supply $V_{cc}$ for the bipolar device. The pad IN (FIG. 3(a)) is the input AC signal pad for bipolar device Q0. In the recovery operation mode, all of these circuits operate at the same conditions as normal operation (except usually no AC signal is applied to the pad IN; this normal state referenced to herein as "idling" the transistor), except the recovery block 100N is turned on by the control signal GRC_$_b$, which is in logic low. During this recovery mode, the current Ibr is supplied into the base of device Q0. By adjusting the magnitude of the current Ibr from 100N, we can force the targeted device Q0 into a forward high current mode and recover the degradation caused by the normal operations. During the device recovery mode, there is no AC signal from input pad IN (i.e. transistor is "idling"); and $V_{CB}$_repair is approx. 0.5 volts to approx. 2.0 volts, $V_{BE}$_repair is approx. 0.9 volts to approx. 1.2 volts, and the period for repair $T_r$ ($T_R$) is approximately 10 seconds to approximately 100 seconds.

The details of the recovery circuit blocks 100N, 100P, are shown in FIG. 3(c) for the npn device and in FIG. 4. They are current sources with switching transistors (pMOSFET P2 in 100N, and nMOSFET N2 in 100P). The magnitudes of the recovery currents are determined by the current source I0$n$, I0$p$ and their current mirror pair N0, N1 (P0, P1). Rn and Rp are the load resistors in the range. Taking 100N as an example, during the normal circuit operation, control signal GRC_$_b$ is in logical high and the transistor P2 is in off state and there is no current to the bipolar device. During the recovery model, GRC_$_b$ is in logic low and switching transistor P2 is turned on. Thus, the recovery current $I_{br}$ flows out into the targeted bipolar device.

Circuit Embodiment 2

Device Current Gain Monitor

Figure 5:
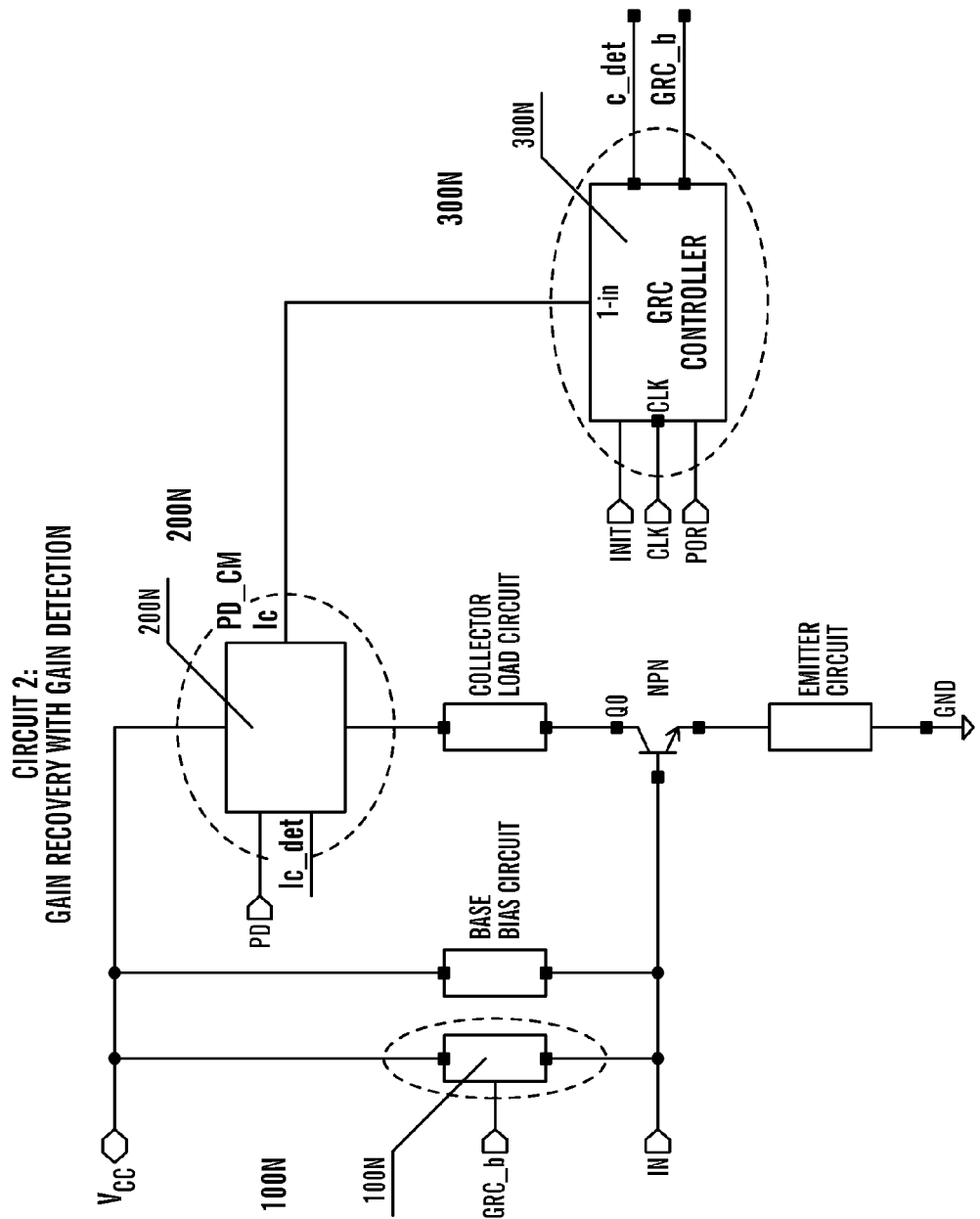
FIG. 5 is a block schematic circuit diagram of a second preferred circuit embodiment of the present invention, including a current monitor 200N connected in series with the collector load circuit and in parallel with the gain recovery circuit 100N and the base bias circuit for the npn transistor Q0, and also connected to a gain recovery controller 300N as shown.

FIG. 5 shows another circuit embodiment including a device current gain monitor 200N employed to determine when the repair process is needed. For simplicity, only monitor circuits for NPN type is shown in FIG. 5 (the monitor circuits for PNP type are similar and can be deduced straight-forwardly by those skilled in the art). The power down PFET (shown in FIG. 3(a)) is replaced by block PD_CM marked 200N. During system initialization (i.e. power-on) sequence, the NPN device is at normal bias conditions, and 200N mirrors the collector current Ic to the GRC_controller block 300N when I$_c$_det is at logic high. Because the base current I$_b$ is known, the gain of the NPN device can be directly calculated with Ic (i.e. current gain $\beta=I_c/I_b$). Block 300N checks the value of I$_c$: if I$_c$ is higher than a pre-defined threshold, no current gain repair is needed; if I$_c$ is lower than the threshold, then 300N starts a gain recovery procedure where a large base current $I_{br}$ is input to the NPN device when GRC_b is at logic low for a pre-defined period of time ($T_R$) ranging from one second to 100 seconds (depending, for example, on the repairing bias voltages $V_{eb}$_repair and $V_{cb}$_repair). When the current gain repair procedure is completed, I$_c$_det is at logic low and GRC_$_b$ is at logic high, the circuit is thus switched back to normal operational mode.

Figure 6:
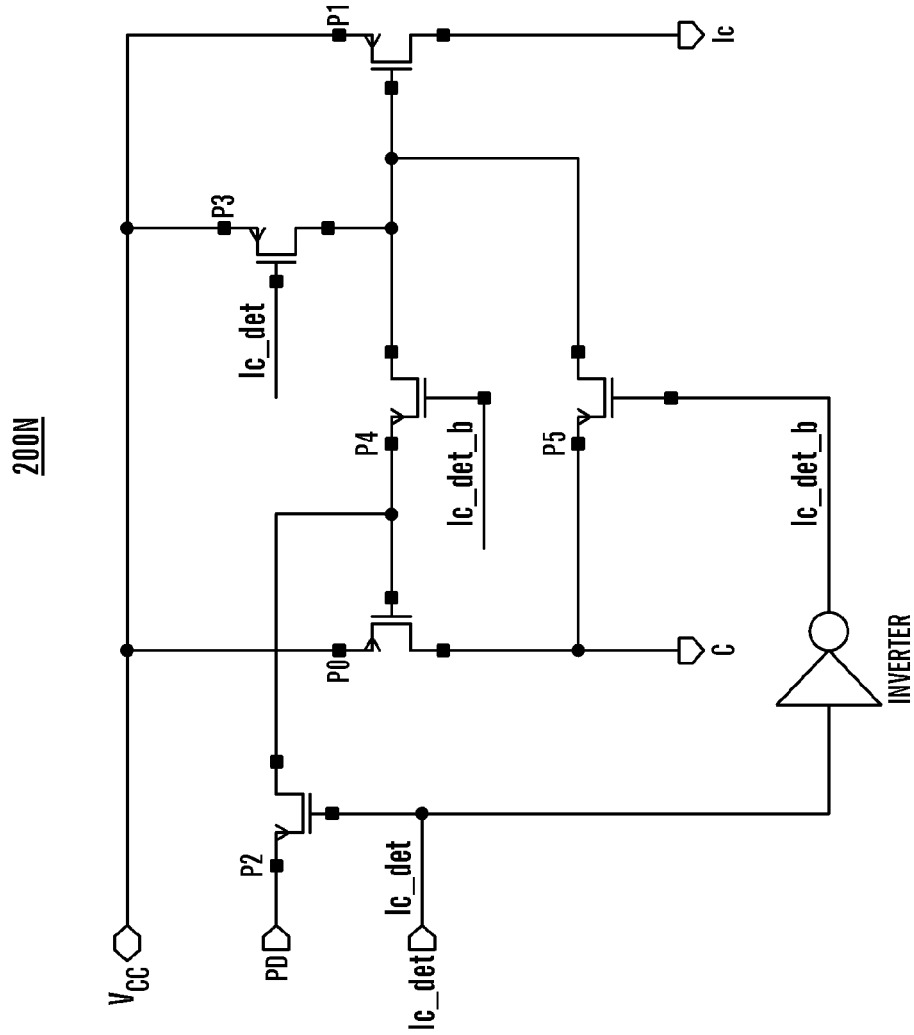
FIG. 6 is a more detailed self-explanatory schematic circuit current diagram of a preferred embodiment of the current monitor 200N that detects and outputs the current $I_c$.

FIG. 6 is a detailed circuit diagram of block 200N shown previously in FIG. 5. During Ic detection step of a current gain repair procedure: I$_c$_det is at logic high and I$_c$_det_b is at logic low, and thus P2 is turned off, the power down signal PD has no control to P0. P4 and P5 are turned on, and P0 and P1 form a current mirror. Terminal C is connected to the NPN device, the collector current is mirrored from the primary side PFET P0 to the secondary PFET P1, the mirrored current is then output through terminal Ic to 300N. When the detection step is complete: I$_c$_det is at logic low and I$_c$_det_b is at logic high, P2 is turned on, the signal PD has the control to P0. P4 and P5 are turned off, P0 and P1 are disconnected, P3 is turned on, P1 is turned off. The circuit is back to the normal operation.

The inverter is any conventional semiconductor inverter, in the BiCMOS Technology, and should have the following parameters or characteristics: threshold voltage set at, for example, (Vcc/2).

Figure 7:
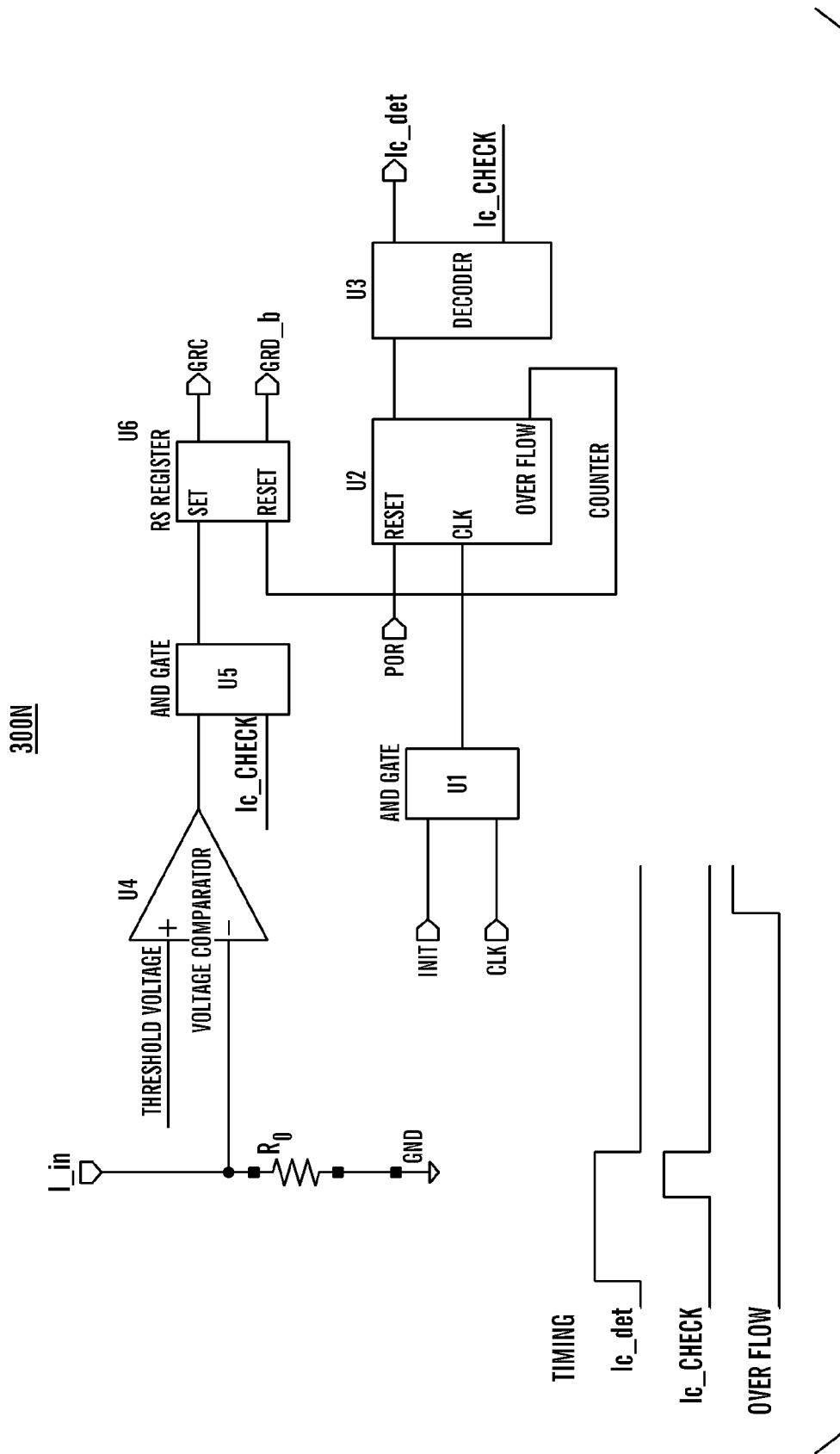
FIG. 7 is a more detailed self-explanatory block schematic circuit diagram of a preferred embodiment of the gain recovery controller 300N, and including preferred timing signals ($I_c\_det$, $I_c\_check$, over flow).

FIG. 7 shows the current gain monitor 300N shown previously in FIG. 5. During system initialization (or power-on) sequence, the signal init is at logic high, the system clock clk determines the input from AND gate U1 to the counter U2. The power on reset signal por resets U2, and then U2 starts to count the clocks. The decoder U3 generates two signals: Ic_det and Ic_check, and the timing of the two signals is shown in the Timing chart in FIG. 7. When Ic_det, the Ic current is mirrored to 300N input I_in of U4 from 200N. If the voltage on RO, due to Ic, is larger than the threshold voltage of the voltage comparator U4, then the output of U4 is at logic low which blocks the pulse of Ic_check, the RS register U6 is thus not triggered, and GRC is at logic low while GRC_$_b$ is at logic high. Under this situation, no current gain repair is triggered. On the other hand, if the voltage on RO is lower than the threshold voltage, then the output of U4 is at logic high. When both Ic_check and U4 output are at logic high, the output of U5 triggers U6, then GRC is at logic high, GRC_b is at logic low, and the current gain repair procedure is initiated. When U2 is over flowed, the signal "over flow" is sent to reset in U6, GRC is then changed from logic high to logic low, while GRC_$_b$ is changed from logic low to logic high. Under such a situation, the current gain repair procedure is ended.

FIG. 8 is a high level flow diagram of a repair method according to an embodiment of the invention, while FIG. 10 is a more detailed flow diagram of the embodiment.

As shown in FIG. 10 the following steps are performed:
provide bipolar transistor.
reverse bias EB junction with a voltage and for a period so as to
degrade current gain I$_c$/I$_b$.
idle the transistor.
forward bias EB junction with a first repair voltage while reverse
bias CB with a second repair voltage for period T$_R$.
wherein first repair voltage, second repair voltage and T$_R$ have the
following relation as set forth in claim 1 of this specification.

Figure 11:
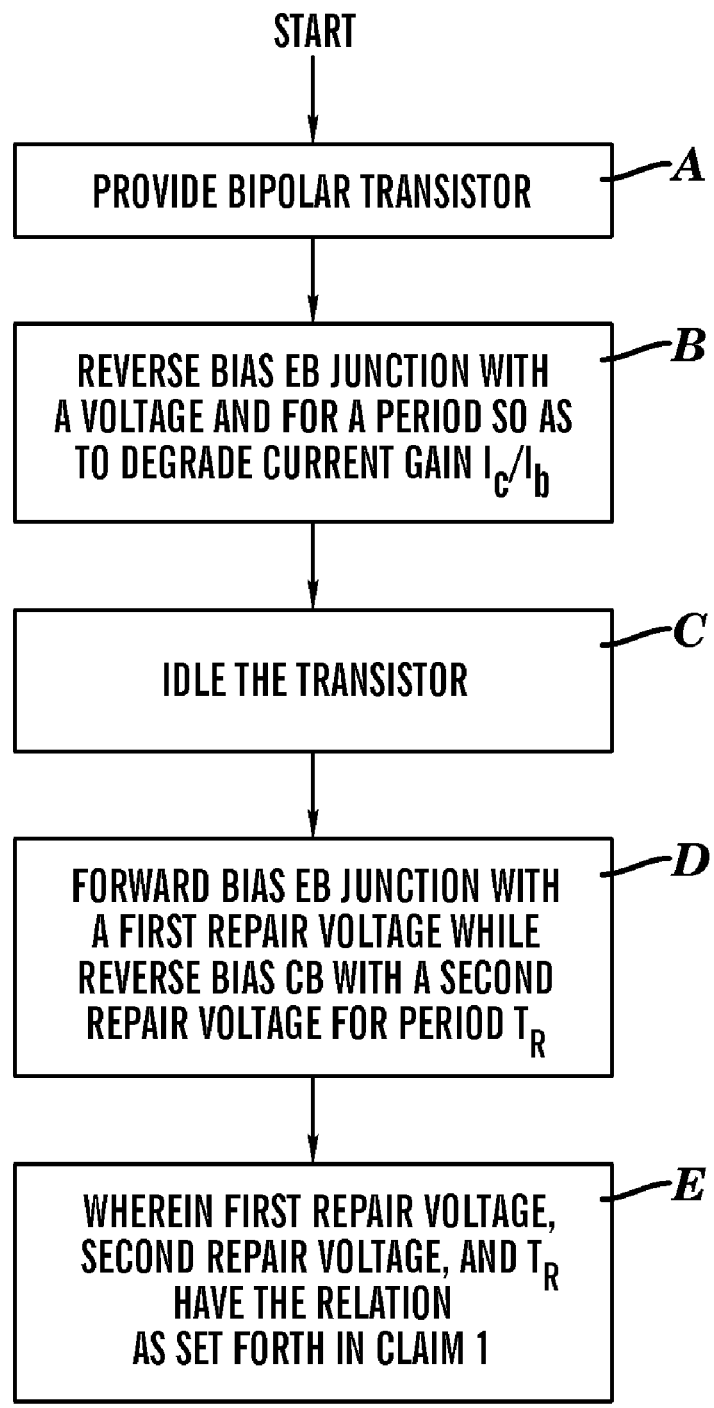
FIG. 11 is a more detailed flow diagram of the method shown in of FIG. 9.

FIG. 9 is a high level flow diagram of a repair method according to another embodiment of the present invention while FIG. 11 is a more detailed flow diagram of the embodiment.

As shown in FIG. 11:
provide bipolar transistor.
reverse bias EB junction with a voltage and for a period so as to
degrade current gain I$_c$/I$_b$.
idle the transistor when degradation reaches threshold.

forward bias EB junction with a first repair voltage while reverse
bias CB with a second repair voltage for period $T_R$.
wherein first repair voltage, second repair voltage and $T_R$ have the
relation as set forth in claim 1 of this specification.
Bipolar Device Recover Relationship with Active Power More Rigorous Calculation of the Relationships Between $T_R$, $V_{CBR}$, $V_{EBR}$, $V_{CER}$, $I_{br}$ The recovery ($\Delta\beta$) of current gain degradation is a function of transistor internal temperature $T_j$ and the time ($T_R$), and generally following equation (1):

$$\Delta\beta = A \times e^{\frac{-E_a}{kT_j}} \times e^{-\frac{\tau}{T_R}}, \qquad (1)$$

Where $\Delta\beta$ is in %, k is Boltzmann constant. $E_a$ is the thermal recovery energy and $\tau$ is the recovery time constant and both $E_a$ and $\tau$ are determined by the device materials and detailed structure.

The transistor internal temperature $T_j$ can be raised by the self-heating effect claimed in this invention as equation (2).

$$T_j = T_{am} + R_{th} \times I_c \times V_{ce}, \qquad (2)$$

Where $T_{am}$ is the ambient temperature and $I_c$ is the transistor collector current, and $V_{ee}$ is the voltage between collector and emitter. $R_{th}$ is the device bipolar transistor thermal resistance and determined by the detailed device structure.

For a predetermined gain recovery ($\Delta\beta$) value, the recovery time and the device forward active current and voltage has following relation, $$\frac{\tau}{T_R} = \ln\left(\frac{A}{\Delta\beta}\right) - \frac{E_a}{k \times (T_{am} + R_{th} \times I_c \times V_{ce})}, \qquad (3)$$

Or by the base current $I_b$ with current gain $\beta$, $$\frac{\tau}{T_R} = \ln\left(\frac{A}{\Delta\beta}\right) - \frac{E_a}{k \times [T_{am} + R_{th} \times \beta \times I_b \times (V_{eb} + V_{cb})]}, \qquad (4)$$

In both equations (3) and (4), the device parameters such as A, k, $E_a$, $\tau$, $\beta$ and $R_{th}$ can be readily determined by the semiconductor manufacturer based on the semiconductor technology (e.g. BiCMOS6WL) in which the bipolar transistor and associated circuits will be manufactured and those skilled in the art in view of the present specification and drawing figures. A, for example, is a recovery factor such as 10E-4 for IBM's 6WL pnp transistor.

As shown in equation (4), by increase the forward base current $I_{br}$ we can lower the recovery time $T_R$.

In the example of FIG. 2) for pnp device in BiCMOS 6WL technology of IBM, $\tau$=5 sec, $E_a$=0.2 eV, $R_{th}$=6000 K/W, it took 30 sec at recovery collector/emitter current of 3 mA to achieve 10% gain recover. If we double the recovery collector current or base current, the recovery time will be decrease to 5 sec. Every semiconductor technology has different parameters such as A, B (discussed below), Rth. A and Rth are constants and are not variable within a particular technology such as 6WL or 8HP. A and B can be determined experimentally or empirically by those skilled in the art in view of the present specification and figures. However, these calculations demonstrate, even more particularly, further preferred relationships applicable to this method and structure to achieve the gain recovery according to the present invention.

A More Simplified Alternate Calculation of Relationships Between $T_R$, $V_{CBR}$, $V_{EBR}$, $V_{CER}$, $I_{br}$ A more simplified relation between recovery time and active power for the device is:

$$T_R = A \times (\Delta\beta)^2 \times \exp[B/(Tam + Rth \times Ie \times Vce)], \qquad (5).$$

Where parameter $\Delta\beta$ is the percentage of the gain recovery, Tam is the ambient temperature, Ie is the forward emitter current in A, and Vce is the voltage in volt, Vce=Veb+Vbc, and Ie is the emitter current in Amp, Rth is the self-heating thermal resistance, in K/Watt. $T_R$ is the recovery time in seconds. The parameter A is the recovery factor, and B is related to the recovery thermal energy. Parameters A, B and Rth are determined by the detailed device structures, such as material, device geometry and package density. The inventors believe they can be readily determined by the device manufacturer and supplied to circuit designers in view of the present specification and figures.

In FIG. 2 as an example, for IBM's BiCMOS6WL PNP transistor, A=8E-7, B=4600, and Rth=6000, it takes 30 seconds to recover 10% of the current gain when the device is forward biased at 3 mA of emitter current and 3.1V of Vce.

A, B, and Rth are fixed constants for 6WL and the relationship (5), and can be determined empirically by those skilled in the art in vew of the present specification and figures.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. Method of recovering gain in a bipolar transistor, comprising:
providing a bipolar transistor including an emitter, a collector, and a base disposed between junctions at the emitter and the collector;
reverse biasing the junction disposed between the emitter and the base with an operational voltage and for an operational time period, so that a current gain $\beta$ of the transistor is degraded;
idling the transistor, and
generating a repair current $I_{br}$ into the base, while forward biasing the junction disposed between the emitter and the base with a first repair voltage ($V_{EBR}$), and while at least partly simultaneously reverse biasing the junction disposed between the collector and the base with a second repair voltage ($V_{CBR}$), for a repair time period ($T_R$), so that the gain is at least party recovered;
wherein $V_{EBR}$, $V_{CBR}$ and $T_R$ have the proportional relationship:

$$T_R \propto (\Delta\beta)^2 \times \exp[1/(Tam+Rth \times Ie \times V_{CER}], V_{CER}=V_{BER}+V_{CBR}, \text{ and } Ie=\beta \times I_{br},$$

$\beta$ is the normal current gain of the transistor, $\Delta\beta$ is the target recovery gain of the transistor in percentage, Tam is the ambient temperature in degrees K, $I_{br}$ is the repair current to the base in μ amps, Rth is the self-heating thermal resistance of the transistor in K/W, $T_R$ is in seconds.

2. The method as claimed in claim 1, wherein $V_{EBR}$ is in a range of approximately 0.8 volts to approximately 1.2 volts.

3. The method as claimed in claim 1, wherein $V_{CBR}$ is in a range of approximately 0.5 volts to approximately 2.0 volts.

4. The method as claimed in claim 1, wherein $T_R$ is in a range of approximately one second to approximately 100 seconds.

5. The method as claimed in claim 1, wherein the transistor is an npn transistor.

6. The method as claimed in claim 1, wherein the transistor is a pnp transistor.

7. The method as claimed in claim 1, wherein Ibr is within a range of approximately 10 µA to approximately 150 µA.

8. The method as claimed in claim 1, wherein $I_{br}$ is within a range of approximately 100 µA to approximately 300 µA.

9. The method as claimed in claim 1, wherein Rth is 6000K/Watt.

10. A method of recovering gain in a bipolar transistor, comprising:
    providing a bipolar transistor including an emitter, a collector, and a base disposed between junctions at the emitter and the collector;
    reverse biasing the junction disposed between the emitter and the base with an operational voltage and for an operational time period, so that a current gain ($I_c/I_b$) of the transistor is degraded;
    idling the transistor when the degradation reaches a threshold; and
    generating a repair current $I_{br}$ into the base while forward biasing the junction disposed between the emitter and the base with a first repair voltage ($V_{EBR}$), and while at least partly simultaneously; reverse biasing the junction disposed between the collector and the base with a second repair voltage ($V_{CBR}$), for a repair time period ($T_R$), so that the gain is at least partly recovered;
    wherein $V_{EBR}$, $V_{CBR}$ and $T_R$ have the proportional relationship:
    $T_R \propto (\Delta\beta)^2 \times \exp[1/(Tam+Rth \times Ie \times V_{CER}]$, $V_{CER}=V_{BER}+V_{CBR}$, and $Ie=\beta \times I_{br}$, $\beta$ is the normal current gain of the transistor, $\Delta\beta$ is the target recovery gain of the transistor in percentage, Tam is the ambient temperature in degrees K, $I_{br}$ is the repair current to the base in µ amps, Rth is the self-heating thermal resistance of the transistor in K/W, $T_R$ is in seconds.

11. The method as claimed in claim 10, wherein $V_{EB}R$ is in a range of approximately 0.8 volts to approximately 1.2 volts.

12. The method as claimed in claim 10, wherein $V_{CBR}$ is in a range of approximately 0.5 volts to approximately 1.0 volts.

13. The method as claimed in claim 10, wherein $T_R$ is in a range of approximately one second to approximately 100 seconds.

14. The method as claimed in claim 10, wherein the transistor is an npn transistor.

15. The method as claimed in claim 10, herein the transistor is a pnp transistor.

16. The method as claimed in claim 10, wherein the idling step includes monitoring values of $I_{br}$.

17. The method as claimed in claim 10, wherein Ibr is within a range of approximately 100 µA to approximately 300 µA.

18. A bipolar transistor recovery arrangement, comprising:
    a bipolar transistor including an emitter, a collector, and a base disposed between junctions at the emitter and the collector, the transistor having a current gain ($\beta$) that is degraded;
    a collector load circuit connected to the collector, an emitter circuit connected to the emitter, and a base bias circuit connected to the base and in parallel with the collector load circuit; and
    a gain recovery circuit connected to the base and in parallel with the base bias circuit, the gain recovery circuit including a current source connected in parallel with a current mirror for generating a repair current ($I_{br}$) to the base during a repair time period ($T_R$); wherein the $V_{BER}$, $V_{CBR}$ and $T_R$ have the proportional relationship:
    $T_R \propto (\Delta\beta)^2 \times \exp[1/(Tam+Rth \times Ie \times V_{CER}]$, $V_{CER}=V_{BER}+V_{CBR}$, and $Ie=\beta \times I_{br}$, $\beta$ is the normal current gain of the transistor, $\Delta\beta$ is the target recovery gain of the transistor in percentage, Tam is the ambient temperature in K, $I_{br}$ is the repair current to the base in µ amps, Rth is the self-heating thermal resistance of the transistor in K/W, $T_R$ is in seconds.

19. The arrangement as claimed in claim 18, wherein $V_{BER}$ is in a range of approximately 0.8 volts to approximately 1.2 volts.

20. The arrangement as claimed in claim 18, wherein $V_{CBR}$ is in a range of approximately 0.5 volts to approximately 2.0 volts.

21. The arrangement as claimed in claim 18, wherein $T_R$ is in a range of approximately one second to approximately 100 seconds.

22. The arrangement as claimed in claim 18, wherein Rth is 6000.

23. The arrangement as claimed in claim 18, wherein $T_R \propto (\Delta\beta)^2 \times \exp[1/(Tam+Rth \times Ie \times V_{CER}]$, and wherein $\beta=4600$.

* * * * *

UNITED STATES PATENT AND TRADEMARK OFFICE
CERTIFICATE OF CORRECTION

PATENT NO. : 7,961,032 B1  
APPLICATION NO. : 12/627282  
DATED : June 14, 2011  
INVENTOR(S) : Zhijian Yang, Ping-Chuan Wang and Kai Di Feng Page 1 of 1

It is certified that error appears in the above-identified patent and that said Letters Patent is hereby corrected as shown below:

In the Claims

Column 10, Approximately line 61,

Claim 1 - replace "$T_R \propto (\Delta\beta)2 \times \exp[1/(Tam+Rth \times le \times V_{CER}]$"

with -- $T_R \propto (\Delta\beta)2 \times \exp[1/(Tam+Rth \times le \times V_{CER})]$ --

Column 11, Approximately line 39,

Claim 10 - replace "$T_R \propto (\Delta\beta)2 \times \exp[1/(Tam+Rth \times le \times V_{CER}]$"

with -- $T_R \propto (\Delta\beta)2 \times \exp[1/(Tam+Rth \times le \times V_{CER})]$ --

Column 11, Approximately line 45,

Claim 11 - replace "$V_{EB}R$" with -- $V_{EBR}$ --

Column 12, Approximately line 28,

Claim 18 - replace "$T_R \propto (\Delta\beta)2 \times \exp[1/(Tam+Rth \times le \times V_{CER}]$"

with -- $T_R \propto (\Delta\beta)2 \times \exp[1/(Tam+Rth \times le \times V_{CER})]$ --

Column 12, Approximately line 47,

Claim 23 - replace "$T_R \propto (\Delta\beta)2 \times \exp[1/(Tam+Rth \times le \times V_{CER}]$"

with -- $T_R \propto (\Delta\beta)2 \times \exp[1/(Tam+Rth \times le \times V_{CER})]$ --

Signed and Sealed this  
First Day of September, 2015

Michelle K. Lee  
*Director of the United States Patent and Trademark Office*